US006975917B2

(12) United States Patent
Sakamoto et al.

(10) Patent No.: US 6,975,917 B2
(45) Date of Patent: Dec. 13, 2005

(54) HEAT TREATMENT METHOD AND HEAT TREATMENT DEVICE

(75) Inventors: Koichi Sakamoto, Tokyo-to (JP); Yuichi Takenaga, Tokyo-to (JP); Takashi Yokota, Tokyo-to (JP); Kazuhiro Kawamura, Tokyo-to (JP)

(73) Assignee: Tokyo Electron Limited, Tokyo-To (JP)

( * ) Notice: Subject to any disclaimer, the term of this patent is extended or adjusted under 35 U.S.C. 154(b) by 22 days.

(21) Appl. No.: 10/485,575

(22) PCT Filed: Aug. 5, 2002

(86) PCT No.: PCT/JP02/07974

§ 371 (c)(1),
(2), (4) Date: Feb. 3, 2004

(87) PCT Pub. No.: WO03/015149

PCT Pub. Date: Feb. 20, 2003

(65) Prior Publication Data

US 2004/0238519 A1 Dec. 2, 2004

(30) Foreign Application Priority Data

Aug. 8, 2001 (JP) .............................. 2001-240025
Nov. 2, 2001 (JP) .............................. 2001-338250

(51) Int. Cl.$^7$ ......................... G06F 19/00; H04L 21/31
(52) U.S. Cl. ...................... 700/121; 29/25.01; 219/390
(58) Field of Search ...................... 700/121; 29/25.01; 438/660; 219/390, 486

(56) References Cited

U.S. PATENT DOCUMENTS 5,942,012 A * 8/1999 Kumasaka et al. ......... 29/25.01
6,306,764 B1 10/2001 Kato et al. .................. 438/660
2002/0014483 A1 * 2/2002 Suzuki et al. ............... 219/486

FOREIGN PATENT DOCUMENTS

| JP | 10-189465 | 7/1998 |
| JP | 2000-031243 | 1/2000 |
| JP | 2000-340554 | 12/2000 |
| JP | 2001-144019 | 5/2001 |
| JP | 2002-025997 | 1/2002 |

OTHER PUBLICATIONS

International Preliminary Examination Report (PCT/IPEA/409) (translated) issued for PCT/JP2002/007974.
Notification of Transmittal of Copies of Translation of the International Preliminary Examination Report (PCT/IB/338).

* cited by examiner

*Primary Examiner*—Leo Picard
*Assistant Examiner*—Steven R. Garland
(74) *Attorney, Agent, or Firm*—Smith, Gambrell & Russell, LLP

(57) ABSTRACT

A thermal processing method selects a batch size range including the number of workpieces to be processed from a plurality of batch size ranges including batch size ranges in which reference numbers smaller than the holding capacity of a workpiece holder are maximums. The workpieces are distributed in the workpiece holder on the basis of the workpiece distribution pattern determined corresponding to the specified batch size range. Processing conditions of the thermal process are determined according to the workpiece distribution pattern. A thermal processing apparatus comprises a controller capable of carrying out the thermal processing method.

18 Claims, 11 Drawing Sheets

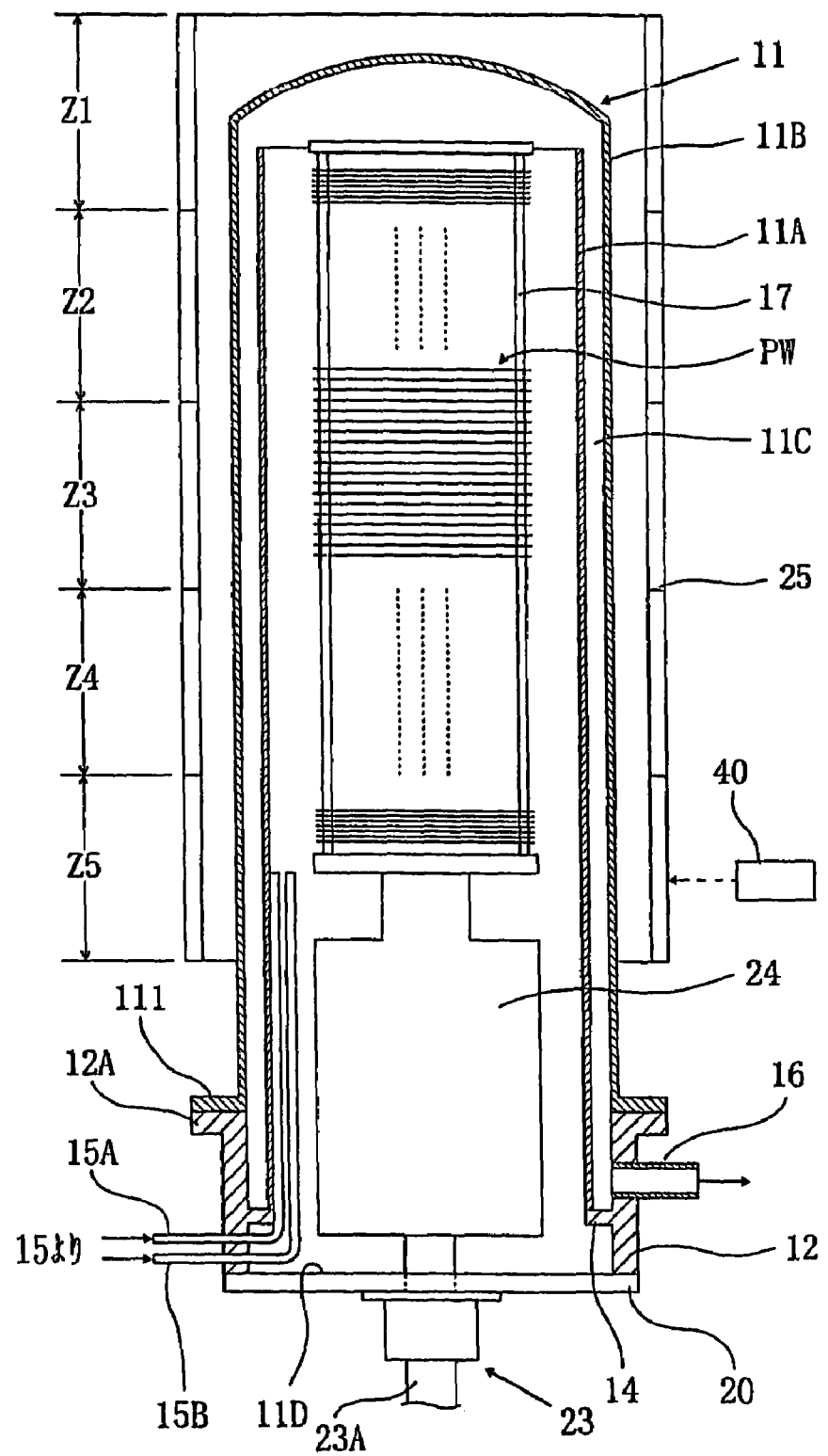
F I G. 1

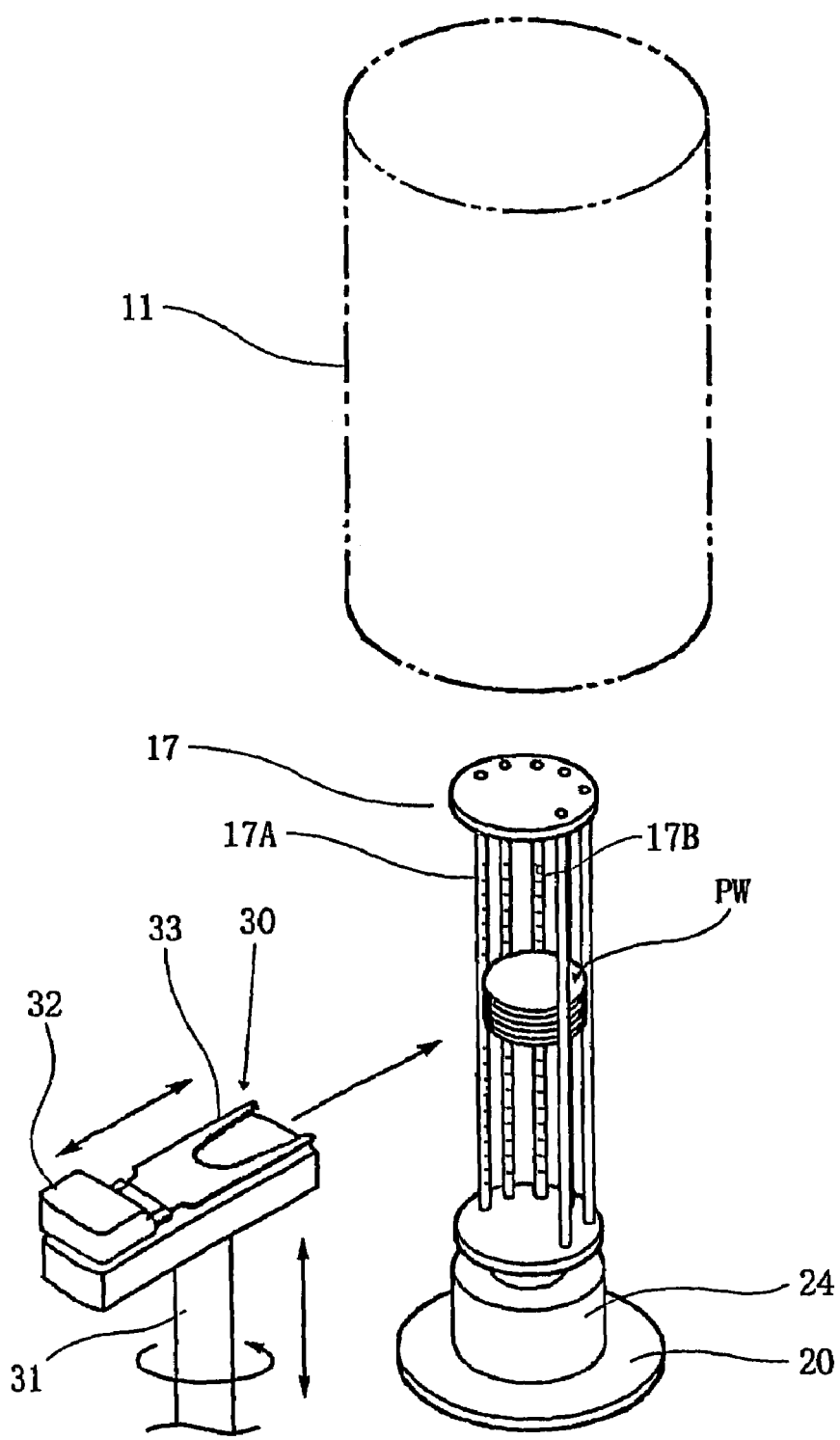
F I G. 2

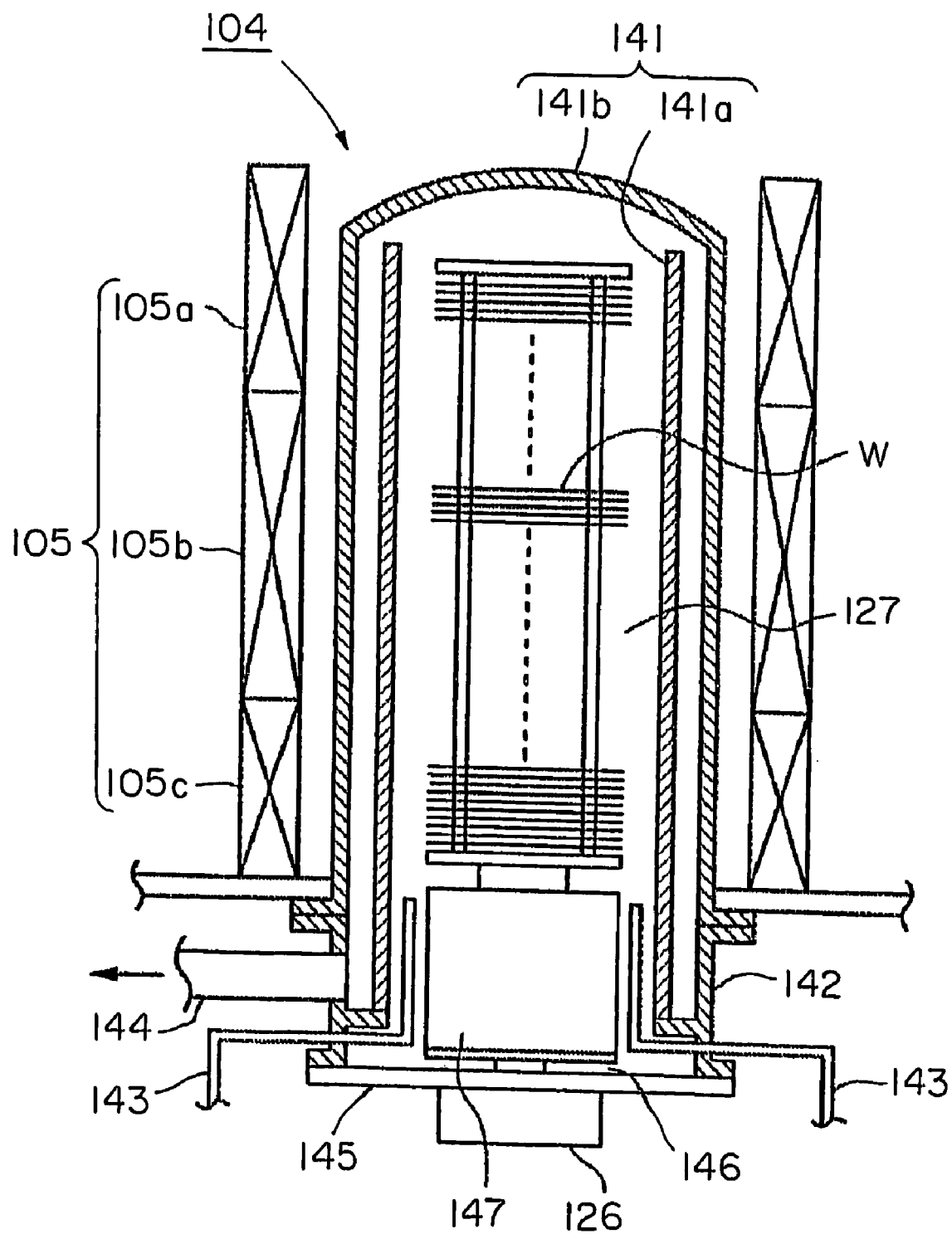
F I G. 6

HEAT TREATMENT METHOD AND HEAT TREATMENT DEVICE

TECHNICAL FIELD

The present invention relates to a thermal processing method and a thermal processing apparatus. More specifically, the present invention relates to a batch thermal processing method of hot-processing a plurality of workpieces in a batch, and a batch thermal processing apparatus for carrying out the same.

BACKGROUND ART

A semiconductor device manufacturing process uses various thermal processing systems for processing workpieces, such as semiconductor wafers, by thermal processes including an oxidation process, a diffusion process and a film formation process. For example, a known batch vertical thermal processing apparatus is capable of processing a plurality of workpieces simultaneously by a thermal process.

This known vertical thermal processing apparatus processes a plurality of semiconductor wafers by a desired thermal process by placing a wafer boat, i.e., a workpiece holder, holding the semiconductor wafers in a horizontal position at predetermined vertical intervals, namely, pitches, in a reaction vessel, evacuating the reaction vessel to create an atmosphere of a negative pressure in the reaction vessel, supplying predetermined process gases into the reaction vessel, and heating the workpieces at a predetermined processing temperature by a heating means.

A wafer boat, such as having a holding capacity of 100 wafers, has, for example, 120 workpiece holding spaces. The wafer boat is fully loaded with semiconductor wafers by placing wafers to be subjected to a desired thermal process (hereinafter, referred to as "objective wafers") in all the workpiece holding spaces in an objective wafer holding region, and placing a plurality of side wafers for stabilizing the thermal process in the rest of the workpiece holding spaces in side wafer holding regions respectively extending above and below the objective wafer holding region. The wafer boat thus fully loaded with the objective wafers and the side wafers is placed in the reaction vessel to subject the objective wafers to the thermal process.

Various types of semiconductor devices have been needed in recent years, and semiconductor wafers often need to be subjected to diverse thermal processes in small lots to manufacture semiconductor devices of diverse types. Therefore, wafer boats are often not fully loaded. In some cases, a wafer boat having a holding capacity of 100 objective wafers is loaded with, for example, fifty or twenty-five objective wafers for a thermal process.

In such a case, a number of dummy semiconductor wafers corresponding to the number of the workpiece holding spaces not occupied by the objective wafers are placed in the unoccupied workpiece holding spaces to load the wafer boat, and the objective wafers thus held on the wafer boat are subjected to a thermal process under the same processing conditions as those for processing objective wafers occupying all the workpiece holding spaces.

Usually, dummy semiconductor wafers that are placed in the unoccupied workpiece holding spaces in the objective wafer holding region are, for example, silicon wafers that are the same in quality as the objective wafers. The dummy wafers are cleaned every several processing cycles, and are thrown away after being used repeatedly. Thus, the dummy wafers increase the running cost and hence it is difficult to process objective wafers efficiently by a thermal process.

DISCLOSURE OF THE INVENTION

The present invention has been made in view of the foregoing circumstances and it is therefore an object of the present invention to provide a thermal processing apparatus and a thermal processing method capable of reducing the number of dummy workpieces that are used when a number of objective workpieces less than the workpiece holding capacity of a workpiece holder are held on the workpiece holder and subjected to a thermal process, and of stably processing the objective workpieces by a desired thermal process in satisfactory inter-workpiece uniformity and satisfactory in-surface uniformity.

According to the present invention, a thermal processing method of processing workpieces by a thermal process in a reaction vessel by placing the workpieces in workpiece holding spaces in a workpiece holder by a loading means, and carrying the workpiece holder loaded with the workpieces into the reaction vessel comprises: a distribution pattern determining step of determining a workpiece distribution pattern in which the workpieces are distributed in the workpiece holder on the basis of the number of the workpieces to be processed; and a loading step of loading the workpieces into the workpiece holder in the thus determined workpiece distribution pattern by the loading means.

The thermal processing method according to the present invention is characterized in that a batch size range including the number of the workpieces is specified on the basis of one or a plurality of batch size ranges in which reference numbers smaller than a holding capacity of the workpiece holder are maximums, and a workpiece distribution pattern is determined for the specified batch size range.

The thermal processing method according to the present invention is characterized in that at least one vacant workpiece holding space is secured between the adjacent workpieces held in the workpiece holder when the workpieces are distributed in a workpiece distribution pattern corresponding to a batch size range in which the reference number smaller than half the holding capacity of the workpiece holder is a maximum.

The thermal processing method according to the present invention is characterized in that workpieces and dummy workpieces are held in the workpiece holder when a workpiece distribution pattern for distributing workpieces smaller in number than the reference number of workpieces for the batch size range is selected, and the number of the dummy workpieces is equal to the difference between the reference number and the number of the workpieces.

According to the present invention, a thermal processing apparatus comprises: a workpiece holder having holding spaces in which workpieces are held; a reaction vessel for containing the workpiece holder therein; a heating means surrounding the reaction vessel; a loading means for loading workpieces into the workpiece holder; and a controller that determines a workpiece distribution pattern in which workpieces are to be distributed in the workpiece holder on the basis of the number of workpieces to be processed, and controls the loading means and the heating means on the basis of the workpiece distribution pattern.

In the thermal processing apparatus according to the present invention, the controller stores batch size ranges in which reference numbers smaller than a holding capacity of the workpiece holder are maximums, and workpiece distribution patterns corresponding to the batch size ranges, and the controller selects a workpiece distribution pattern corresponding to a batch size range including the number of workpieces to be processed.

The thermal processing apparatus according to the present invention is characterized in that at least one vacant holding space is secured between the adjacent workpieces held in the workpiece holder when the workpieces are distributed in a workpiece distribution pattern corresponding to a batch size range in which the reference number smaller than half the holding capacity of the workpiece holder is a maximum.

The thermal processing apparatus according to the present invention characterized in that the controller comprises: a distribution pattern storage unit storing batch size ranges including the numbers of workpieces to be processed, and workpiece distribution patterns corresponding to the batch size ranges; processing condition storage unit storing processing conditions for the workpiece distribution patterns; a central processing unit that selectively reads a workpiece distribution pattern corresponding to the number of workpieces from the distribution pattern storage unit, and reads a processing condition on the basis of the selected workpiece distribution pattern from the processing condition storage unit; a loading means control unit that controls the loading means so that workpieces and dummy workpieces are distributed in the workpiece holder in the selected workpiece distribution pattern; and a heating means control unit that controls the heating means so that the workpieces are processed by a thermal process under the processing conditions read by the central processing unit.

The thermal processing apparatus according to the present invention characterized in that the controller further comprises a dummy workpiece quantity setting unit that calculates the difference between the reference number of the selected workpiece distribution pattern and the number of the workpieces, and sets the number of dummy workpieces to be used in combination with the workpieces.

The thermal processing apparatus according to the present invention is characterized in that the heating means control unit is capable of controlling the heating means so that a plurality of heating zones in a thermal processing atmosphere in the reaction vessel are heated at processing temperatures determined respectively for the heating zones.

According to the present invention, when workpieces smaller in number than the holding capacity of the workpiece holder are to be subjected to a thermal process, processing conditions are set for workpiece distribution patterns corresponding to the numbers of workpieces. Therefore, dummy workpieces necessary to realize a selected workpiece distribution pattern exactly are loaded together with the workpieces into the workpiece holder. Thus, the number of necessary dummy workpieces can be reduced, whereby the running cost can be reduced and the workpieces can be efficiently processed by the predetermined thermal process. Moreover, since the workpieces can be distributed exactly conforming to the selected distribution pattern, each of the workpieces can be processed basically in high in-surface uniformity, and the workpieces disposed at different positions can be processed in high inter-workpiece uniformity.

Since a workpiece distribution pattern in which workpieces to be subjected to a thermal process are distributed in the workpiece holder is selected on the basis of the number of the workpieces, and processing conditions for the selected workpiece distribution pattern are determined automatically, a pattern of distributing the workpieces in the workpiece holder, and the processing conditions can be very easily set.

Since the same workpiece distribution pattern is selected for the numbers of workpieces included in the same batch size range, a number of dummy workpieces equal to the difference between the maximum in the batch size range and the number of the workpieces are used. Thus, workpieces in different numbers included in the batch size range can be processed by a desired thermal process under the same processing conditions.

Particularly, when the number of workpieces to be processed is smaller than the reference number for a workpiece distribution pattern corresponding to a batch size range having a maximum smaller than half the holding capacity of the workpiece holder, the workpieces are distributed in the workpiece holder uniformly with at least one vacant holding space secured between the adjacent workpieces. Therefore, processing conditions including temperature and concentrations of process gases are substantially the same for all the workpieces. Consequently, each of the workpieces can be processed in a high in-surface uniformity, and the workpieces disposed at different positions can be processed in high inter-workpiece uniformity.

The thermal processing method according to the present invention is characterized in that the workpiece distribution pattern in which the workpieces are distributed in the workpiece holder is selected on the basis of the number of workpieces to be processed from a plurality of workpiece distribution patterns stored in a workpiece distribution pattern storage unit.

The thermal processing method according to the present invention is characterized in that the distribution pattern storage unit stores workpiece distribution patterns, each specifying regions in which workpieces are to be distributed, and vacant regions in which any workpieces are not distributed.

The thermal processing method according to the present invention further comprises a dummy workpiece quantity calculating step of comparing the number of workpieces specified by the selected workpiece distribution pattern and the number of workpieces to be processed, and calculating the number of dummy workpieces to be placed in vacant workpiece holding spaces on the basis of the result of comparison.

The thermal processing method according to the present invention is characterized in that the loading step of loading workpieces into the workpiece holder distributes workpieces to be processed and the calculated number of dummy workpieces in the workpiece holder in a selected workpiece distribution pattern.

The thermal processing method according to the present invention further comprises a batch size determining step of determining a batch size on the basis of the number of workpieces to be processed by making reference to a batch size table including a plurality of batch sizes, wherein the distribution pattern selecting step selects the workpiece distribution pattern corresponding to a determined batch size determined by the batch size determining step and distribution patterns stored in the workpiece distribution pattern storage unit.

The thermal processing apparatus according to the present invention is characterized in that the controller includes a distribution pattern storage unit storing workpiece distribution patterns in which workpieces are to be distributed in the workpiece holder; a distribution pattern selecting unit for selecting the workpiece distribution pattern corresponding to the number of workpieces to be processed from those stored in the distribution pattern storage unit; and a loading operation control unit for controlling the loading means to load workpieces into the workpiece holder in accordance with the selected workpiece distribution pattern.

The thermal processing apparatus according to the present invention is characterized in that the distribution pattern storage unit stores workpiece distribution patterns, each specifying workpiece holding spaces in which workpieces are to be held, and vacant holding spaces in which any workpieces are not held.

The thermal processing apparatus according to the present invention is characterized in that the controller further includes a dummy workpiece quantity calculating means that compares the number of workpieces to be processed and the number of workpieces specified by a selected workpiece distribution pattern, and calculates the number of dummy workpieces to be placed in vacant workpiece holding spaces in a workpiece holding region on the basis of the result of comparison.

The thermal processing apparatus according to the present invention is characterized in that the controller further comprises a batch size table storage unit storing a batch size table including the relation between a plurality of batch sizes and the numbers of workpieces included in batches; wherein the distribution pattern selecting unit determines a batch size including the number of workpieces to be processed in a batch by making reference to the batch size table storage unit, and selects the workpiece distribution pattern corresponding to the determined batch size and workpiece distribution patterns stored in the distribution pattern storage unit.

The thermal processing apparatus according to the present invention is characterized in that the controller further includes a process recipe storage unit storing processing conditions including values of parameters of thermal processes and processing procedures, and a processing condition selecting means for selecting processing conditions from the process recipe storage unit;

wherein the value of at least one of the parameters of each of the thermal processes is determined on the basis of a batch size.

The thermal processing apparatus according to the present invention is characterized in that the process recipe storage unit stores at least temperatures in the reaction vessel and gas flow rates as the parameters.

The thermal processing apparatus according to the present invention is characterized in that the controller further includes a distribution pattern recipe selecting means that stores full-batch distribution pattern recipes specifying fully loading the workpiece holder for a thermal process, and a flexible-batch distribution pattern recipe specifying loading the workpiece holder in a workpiece distribution pattern corresponding to the number of workpieces of a batch, and selects either the full-batch distribution pattern recipe or the flexible-batch distribution pattern recipe, and the controller selects the workpiece distribution pattern by the distribution pattern selecting means when the distribution pattern recipe selecting means selects the flexible-batch distribution pattern recipe.

The frequency of using the dummy workpieces can be reduced and time necessary for loading the workpiece holder with workpieces for each cycle of the thermal process by preparing workpiece distribution patterns respectively for different batch sizes. Throughput can be increased and load on operators can be decreased by automating a series of operations for workpiece distribution pattern selection, calculating the number of workpieces to be placed in spaces to be filled in a selected workpiece distribution pattern, and loading workpieces and, when necessary, dummy workpieces into the workpiece holder.

A workpiece distribution pattern that reduces the number of necessary dummy workpieces can be readily and quickly selected, and thereby the aforesaid effects can be enhanced.

The process recipes ensuring uniformly processing workpieces can be selected regardless of the number of workpieces to be processed. The foregoing parameters may include, for example, temperature and pressure in the reaction vessel, and flow rates of process gases.

BRIEF DESCRIPTION OF THE DRAWINGS

FIG. 1 is a schematic sectional view of a thermal processing apparatus in a first embodiment according to the present invention;

FIG. 2 is a perspective view of assistance in explaining the operation of a loading mechanism included in the thermal processing apparatus shown in FIG. 1 in relation with a wafer boat;

FIG. 6 is a longitudinal sectional view of a furnace and the associated devices;

BEST MODE FOR CARRYING OUT THE INVENTION

First Embodiment

Figure 3:
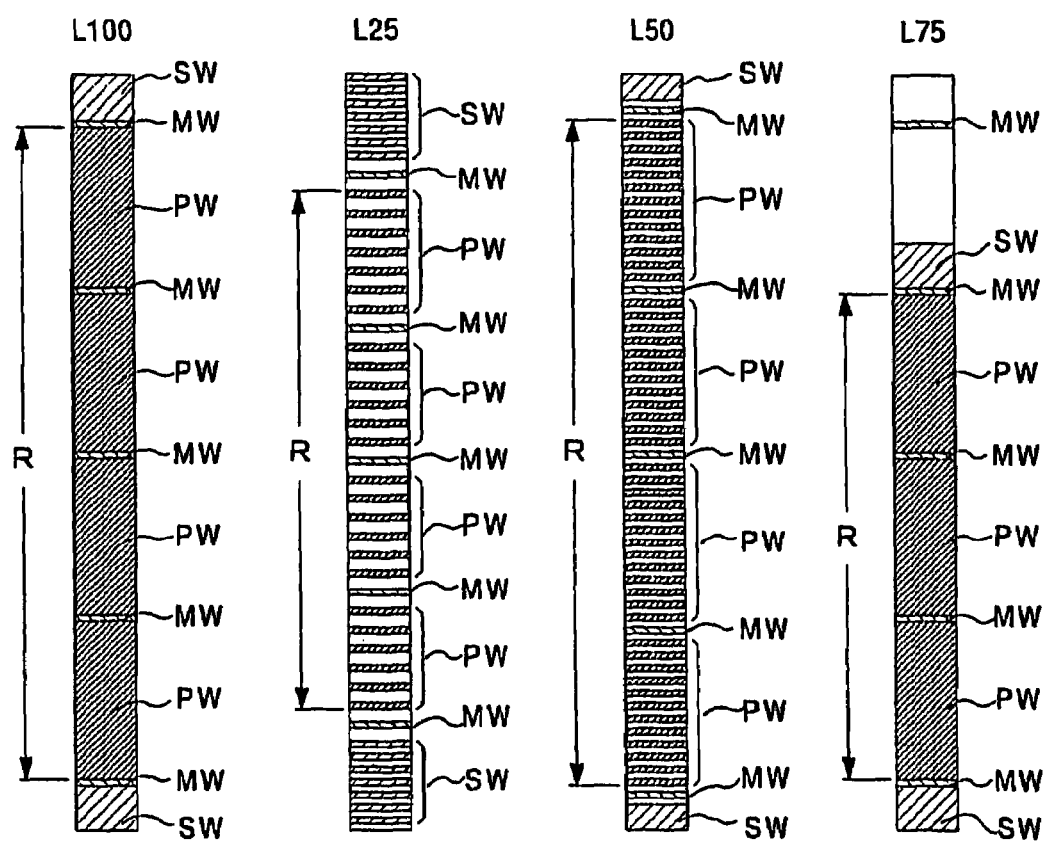
FIG. 3 is a view of assistance in explaining wafer distribution patterns in which semiconductor wafers are distributed on a wafer boat.

A vertical thermal processing apparatus in a first embodiment carries out a CVD process, i.e., a thermal process, to deposit a film on semiconductor wafers, i.e., workpieces.

FIG. 1 is a schematic sectional view of a thermal processing apparatus in a first embodiment according to the present invention.

The vertical thermal processing apparatus has a double-wall reaction tube (processing tube) 11 including a straight inner tube 11A set in an upright position and having an open upper end, and an outer tube 11B disposed coaxially with the inner tube 11A so as to surround the inner tube 11A and having a closed upper end. The inner tube 11A and the outer tube 11B define an annular space 11C. A loading zone extends under the reaction tube 11. Objective semiconductor wafers PW are loaded into a wafer boat 17 in the loading zone.

The inner tube 11A and the outer tube 11B are formed of a heat-resistant, corrosion resistant material, such as quartz glass of a high purity.

The outer tube 11B of the reaction tube 11 is mounted on a manifold 12 having a short, cylindrical shape and provided at its upper end with a flange 12A. The outer tube 11B is provided at its lower end with a flange 111. The flanges 111 of the outer tube 11B and the flange 12A of the manifold 12 are joined together with a sealing member, not shown, such as an O ring, held between the flanges 111 and 12A. Thus, the outer tube 11B of the reaction tube 11 is hermetically fastened to the manifold 12.

The inner tube 11A of the reaction tube 11 extends down beyond the lower end of the outer tube 11B into the manifold 12. The inner tube 11A is supported on an annular support ridge 14 formed on the inner surface of the manifold 12.

Figure 4:
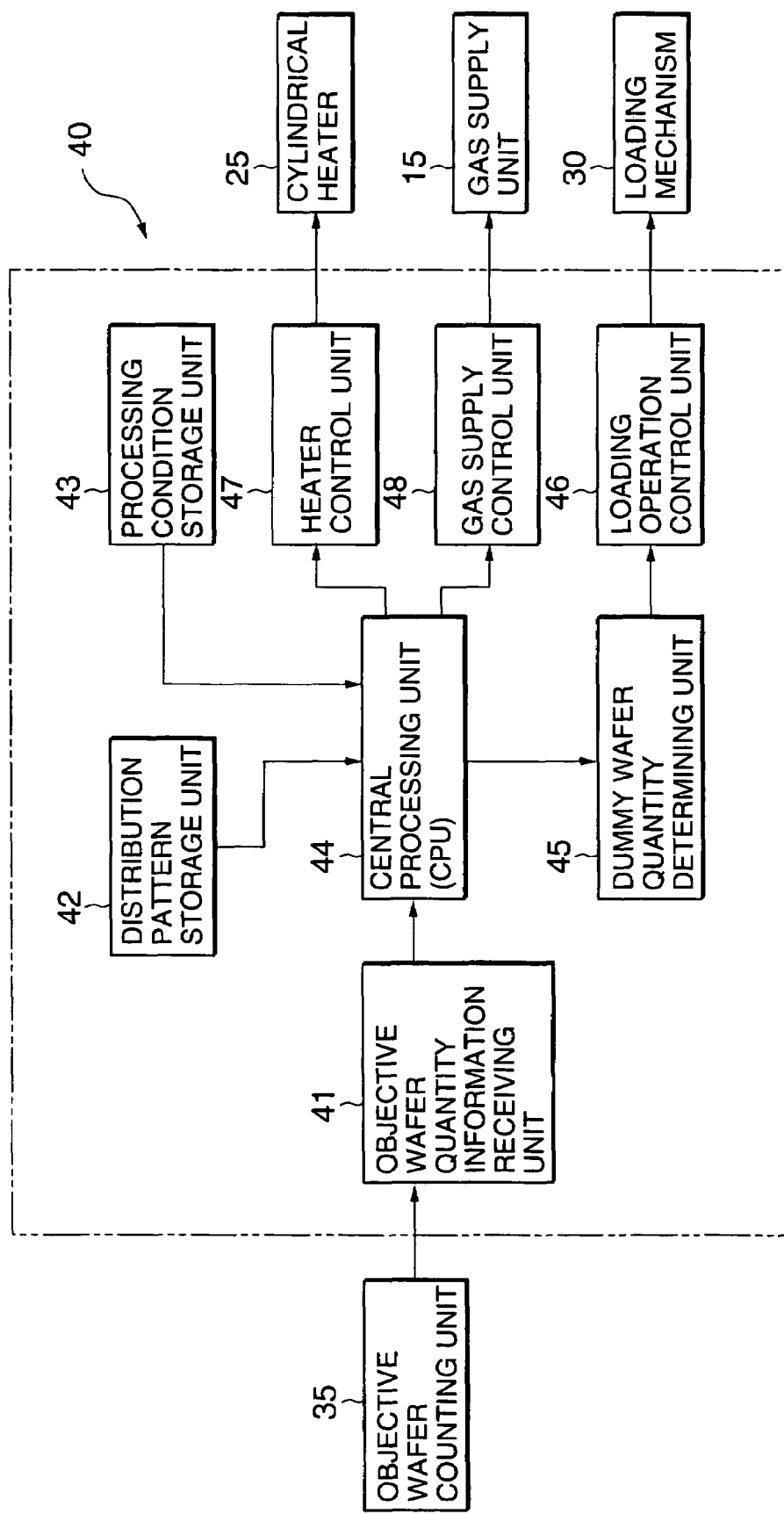
FIG. 4 is a block diagram of a controller included in the thermal processing apparatus shown in FIG. 1.

A process gas supply pipe 15A and an inert gas supply pipe 15B penetrate the side wall of the manifold 12 hermetically and extend upward inside the inner tube 11A. A process gas and an inert gas are supplied through the process gas supply pipe 15A and the inert gas supply pipe 15B, respectively, into the reaction tube 11. The process gas supply pipe 15A and the inert gas supply pipe 15B are connected to a gas supply unit 15 (FIG. 4).

An exhaust pipe 16 is connected to a part, diametrically opposite to a part through which the process gas supply pipe 15A and the inert gas supply pipe 15B are extended, of the side wall of the manifold 12 so as to open into the annular space 11C to exhaust the reaction tube 11 of gases. An exhaust system, not shown, including, for example, a vacuum pump and a pressure regulator is connected to the exhaust pipe 16 to maintain the interior of the reaction tube 11 at a predetermined pressure.

An elevating mechanism is disposed below the reaction tube 11 to load the wafer boat 17 into and unloading the same from the reaction tube 11 by vertically moving the wafer boat 17. The elevating mechanism includes a disk-shaped lid 20 for closing the lower end opening 11D of the reaction tube 11.

A rotative drive unit 23 is disposed below the lid 20. The rotative drive unit 23 has a rotative drive shaft 23A hermetically penetrating the lid 20, and having an upper end connected to the bottom wall of an insulating cylinder (heat-insulating member) 24.

A cylindrical heater (heating means) 25 is installed so as to surround the reaction tube 11. The cylindrical heater 25 heats objective semiconductor wafers PW to be subjected to the thermal process (hereinafter, referred to as "objective wafers PW") loaded into the reaction tube 11.

The cylindrical heater 25 is provided with a cylindrical, insulating member, not shown, holding resistive heating elements having the shape of a wire wound in a spiral shape or a meandering shape. The resistive heating elements are connected to a controller 40. The controller 40 controls power supplied to the resistive heating elements so that the objective wafers PW are heated at a predetermined temperature.

The cylindrical heater 25 is capable of individually heating, for example, vertically arranged five heating zones Z1 to Z5 shown in FIG. 1 in a zone heating mode.

The wafer boat 17 is formed of, for example, high-purity quartz glass. As shown in FIG. 2, the wafer boat 17 has posts 17A provided with holding parts 17B provided with, for example, grooves to hold a plurality of round objective wafers PW, such as 100 to 150 objective wafers PW, in a horizontal position at predetermined vertical pitches. The lid 20 is held at a loading position, i.e., the lowermost position, to place a plurality of objective wafers PW in the holding parts in a distribution specified by a wafer distribution pattern determined for the number of the objective wafers PW (hereinafter, referred to as "reference wafer distribution pattern") by a loading mechanism 30.

The loading mechanism 30 includes a vertical shaft 31, an elongate, rectangular loading head 32 mounted on the shaft 31, one or some thin, forklike transfer arms 33 placed for longitudinal sliding on the loading head 32. The number of the transfer arms 33 is, for example, in the range of one to five.

The controller 40 controls the operation of the loading mechanism 30 for moving the loading head 32 vertically, turning the loading head 32 and longitudinally moving the transfer arms 33.

Reference distribution patterns in which the objective wafers PW are distributed in the wafer boat 17 are set so as to correspond to one or a plurality of batch size ranges in which reference numbers smaller than the holding capacity of the wafer boat 17 are set as maximum numbers. A reference distribution pattern for a batch size range including the number of objective wafers PW to be processed is selected. Although there is not any particular restrictions on a method of setting the reference number, it is preferable, in view of distributing objective wafers PW uniformly at specified intervals, that the method sets a reference number equal to 1/n of the holding capacity of the wafer boat 17, where n is an integer not smaller than 2.

The reference distribution patterns specify the positions of the holding parts in which objective wafers PW are to be held.

The reference distribution patterns are classified roughly into a group 1 of those for batch size ranges having reference numbers equal to the holding capacity of the wafer boat 17, a group 2 of those for batch size ranges having reference numbers smaller than a half the holding capacity of the wafer boat 17, and a group 3 of those for batch size ranges having reference numbers greater than a half the holding capacity of the wafer boat 17.

The reference distribution patterns of the group 2 specify the uniform distribution of objective wafers PW in the wafer boat 17 with at least one vacant holding space left between the adjacent objective wafers PW.

More concretely, suppose that the wafer boat 17 has a holding capacity of 100 objective wafers PW to subject 100 objective wafers W in a batch to one cycle of a thermal process. Then, for example, four reference distribution patterns L25, L50, L75 and L100 are determined. The reference distribution pattern L25 is used for a batch size range between one and twenty-five objective wafers PW, the reference distribution pattern L50 is used for a batch size range between twenty-six and fifty objective wafers PW, the reference distribution patter L75 is used for a batch size range between fifty-one and seventy-five objective wafers PW, and the reference distribution pattern L100 is used for a batch size range between seventy-six and hundred objective wafers PW.

In the reference distribution patterns L25, L50, L75 and L100, predetermined numbers of semiconductor wafers for temperature compensation for objective wafers PW (hereinafter, referred to as "side wafers SW") are placed on the holding parts 17B arranged above and under an objective wafer distribution range R, respectively.

In the reference distribution pattern L100, objective wafers PW are placed on all the holding parts 17B in the objective wafer distribution range R, and for example, seven side wafers SW are placed on each of groups of holding parts 17B above and under the objective wafer distribution range R.

In the reference distribution pattern L25 for the batch size range, where the reference number is twenty-five equal to a quarter of the holding capacity of the wafer boat 17, two successive vacant holding parts 17B are left between the adjacent objective wafers PW; that is, in the reference distribution pattern L25, objective wafers PW are distributed uniformly at equal pitches three times those at which in the reference distribution pattern L100, objective wafers PW are distributed. In the reference distribution pattern L25, for example, seven side wafers SW are placed on each of groups of the holding parts 17B over and under the objective wafer distribution region R at equal pitches, for example, twice pitches at which in the reference distribution pattern L100, side wafers SW are distributed.

When the number of objective wafers PW to be processed is smaller than the reference number of twenty-five of the batch size range, a number of dummy wafers equal to the difference between the reference number and the number of the objective wafers PW are held in the wafer boat 17 together with the objective wafers PW, so that the objective wafers PW and the dummy wafers are distributed so as to conform to the reference distribution pattern L25.

In the reference distribution pattern L50 for the batch size range, where the reference number is equal to a half the holding capacity of the wafer boat 17, namely, fifty, one vacant holding part 17B is left between the adjacent objective wafers PW. That is, in the reference distribution pattern L50, objective wafers PW are distributed uniformly at equal pitches twice those at which in the reference distribution pattern L100, objective wafers PW are distributed. In the reference distribution pattern L50, for example, four side wafers SW are palced in each of groups of the holding parts 17B over and under the objective wafer distribution region R at equal pitches, for example, at pitches equal to those at which in the reference distribution pattern L100, side wafers SW are distributed.

When the number of objective wafers PW to be processed is smaller than the reference number of fifty of the batch size range, a number of dummy wafers equal to the difference between the reference number and the number of the objective wafers PW are placed in the wafer boat 17 together with the objective wafers PW.

In the reference distribution pattern L75, objective wafers PW are distributed on the upstream side with respect to the flowing direction of the process gas, i.e., the lower side as viewed in FIG. 3, at pitches equal to those at which in the reference distribution pattern L100, objective wafers PW are distributed. In the reference distribution pattern L75, for example, seven side wafers SW are placed in each of groups of the holding parts 17B over and under the objective wafer distribution region R.

When the number of objective wafers PW to be processed is smaller than the reference number of seventy-five of the batch size range, a number of dummy wafers equal to the difference between the reference number and the number of the objective wafers PW are placed in the wafer boat 17 together with the objective wafers PW.

In each of the reference distribution patterns L25, L50, L75 and L100, semiconductor wafers, such as (unprocessed semiconductor wafers) are placed as monitor wafers MW in optional ones of the holding parts 17B in the objective wafer distribution range R to confirm the result of processing. In the reference distribution pattern L75, for example, one monitor wafer MW is placed in a blank region over the objective wafer distribution region R in the wafer boat 17.

Referring to FIG. 4, the controller 40 of the vertical thermal processing apparatus in the first embodiment comprises an objective wafer quantity information receiving unit 41 that receives objective wafer quantity information from an objective wafer counting unit 35 that counts the number of objective wafers PW to be processed; a distribution pattern storage unit 42 storing the reference distribution patterns; a processing condition storage unit 43 storing processing conditions; a central processing unit (CPU) 44 that specifies a batch size range including the number of the objective wafers PW on the basis of the objective wafer quantity information received by the objective wafer quantity information receiving unit 41, selects a reference distribution pattern corresponding to the specified batch size range from those stored in the distribution pattern storage unit 42, and reads processing conditions corresponding to the selected reference distribution pattern from the processing condition storage unit 43; a dummy wafer quantity determining unit 45 that compares the reference number of the selected reference distribution pattern, and the number of the objective wafers PW, and determines the number of necessary dummy wafers; a loading operation control unit 46 that controls the loading mechanism 30 to distribute the objective wafers PW and the dummy wafers in the selected reference distribution pattern in the wafer boat 17; a heater control unit 47 for controlling power supply to the cylindrical heater 25; and a gas supply control unit 48 for controlling the gas supply unit 15 to regulate the supply of the process gas.

The vertical thermal processing apparatus thus constructed places the objective wafers PW in the holding parts of the wafer boat 17 in the reference distribution pattern automatically determined according to the number of the objective wafers PW, and processes the objective wafers PW for a film deposition process under the specific processing conditions corresponding to the selected reference distribution pattern.

The objective wafer counting unit 35 counts automatically the number of the objective wafers PW to be subjected to the desired film deposition process, and gives objective wafer quantity information about the number of the objective wafers PW to the objective wafer quantity information receiving unit 41. Then, the CPU 44 selects the reference distribution pattern for the specified batch size range including the number of the objective wafers PW from those stored in the distribution pattern storage unit 42. Then, the loading mechanism places the objective wafers PW in the holding parts 17B on the basis of the selected reference distribution pattern from the top holding part downward. The loading operation control unit 46 controls the loading mechanism 30 to move the loading head 32 vertically and turn the loading head 32, and to move the transfer arms 33 longitudinally so as to distribute the objective wafers PW in the selected reference distribution pattern in the wafer boat 17.

The dummy wafer quantity determining unit 45 compares the reference number of the selected reference distribution pattern, and the number of the objective wafers PW. When the number of the objective wafers PW is smaller than the reference number for the batch size range including the number of the objective wafers PW, the dummy wafers are placed in the vacant holding parts to distribute the objective wafers PW and the dummy wafers so as to conform to the reference distribution pattern.

By the elevating mechanism, the lid 20 is elevated to carry the wafer boat 17 into the reaction tube 11 and to seal the lower end opening 11D of the reaction tube 11 hermetically. Subsequently, the exhaust system is actuated to evacuate the reaction tube 11 to set the interior of the reaction tube 11 at a predetermined pressure, the cylindrical heater 25 is energized to heat the objective wafers PW at a predetermined processing temperature, the process gas is supplied through the process gas supply pipe 15A into the reaction tube 11 to process the objective wafers PW by the film deposition process.

In the vertical thermal processing apparatus, processing conditions including set temperatures (temperature profiles) for the heating zones Z1 to Z5 are set for the reference distribution patterns, respectively, and the processing conditions are stored in the processing condition storage unit 43. The CPU 44 selects the reference distribution pattern for the measured number of the objective wafers PW from the distribution pattern storage unit 42, and selects a temperature profile on the basis of the selected reference distribution pattern from those stored in the processing condition storage unit 43.

The heater control unit 47 control the operation of the cylindrical heater 25 by controlling power to be supplied to the cylindrical heater 25 on the basis of the selected temperature profile so that the heating zones Z1 to Z5 in the reaction tube 11 are heated at predetermined processing temperatures, respectively. The gas supply control unit 48 controls the gas supply unit 15 to regulate the supply of the process gas such that the interior of the reaction tube 11 is maintained at a predetermined gas concentration to process the objective wafers PW by the film deposition process.

For example, the temperature profile corresponding to the reference distribution pattern L25 is determined by subjecting the reference number of objective wafers PW (twenty-five wafers) which are loaded into the wafer boat 17 in the reference distribution pattern L25 to a thermal process heating the objective wafers PW in the same reference temperature profile defining set temperatures respectively for the heating zones Z1 to Z5 as that where the wafer boat 17 is fully loaded with objective wafers PW in the reference distribution pattern L100, and adjusting the reference temperature profile on the basis of the result of the thermal process determined by examining the thus processed objective wafers PW. The temperature profile for the reference distribution pattern L25 is stored in the processing condition storage unit 43 of the controller 40.

Temperature profiles for the reference distribution patterns L50 and L75 are determined in the same manner.

This thermal processing method does not need to use processing conditions needed by the conventional thermal processing method for processing objective wafers in a state where the wafer boat 17 is fully loaded with the objective wafers PW and many dummy wafers. The number of dummy wafers needed by this thermal processing method is not the difference between the number of objective wafers and the loading capacity of the wafer boat 17 and is the difference between the number of objective wafers and the reference number of the selected reference distribution pattern, which is smaller than the former difference.

Since objective wafers and dummy wafers can be distributed so as to conform to the selected reference distribution pattern, and the processing conditions are determined empirically, all the objective wafers PW can be substantially uniformly processed by the film deposition process in high in-surface uniformity. Since the temperatures in the heating zones are controlled individually, the objective wafers PW held at different positions in the wafer boat 17 can be processed by the film deposition process, i.e., the thermal process, in high inter-wafer uniformity.

In the reference distribution patterns L25 or L50 having the reference number smaller than half the holding capacity of the wafer boat 17, objective wafers PW are distributed uniformly at pitches three times or twice the pitches at which objective wafers PW are distributed in the reference distribution pattern L100. Therefore, all the objective wafers PW can be processed under the substantially the same processing conditions including, for example, processing temperature and process gas concentration. Consequently, all the objective wafers PW can be processed in high in-surface and inter-wafer uniformity.

Thus, the thermal processing method of the present invention is capable of stably processing objective wafers PW by a desired film deposition process, using a small number of dummy wafers. Consequently, the running cost can be reduced and the desired film deposition process can be efficiently carried out.

The proper reference distribution pattern in which objective wafers PW are to be distributed on the wafer boat 17 is selected on the basis of the number of the objective wafers PW, and processing conditions corresponding to the selected reference distribution pattern are selected automatically. Thus, the distribution of the objective wafers PW in the wafer boat 17 and the selection of the processing conditions can be very easily achieved and thereby working efficiency can be improved.

Since the same reference distribution pattern is used for distributing objective wafers in numbers in the same batch size range, objective wafers PW can be subjected to a desired thermal process without changing the processing conditions even if the number of the objective wafers PW is changed within the batch size range. In this case, only the number of dummy wafers needs to be changed.

The vertical thermal processing apparatus of the present invention capable of carrying out the foregoing thermal processing method is capable of stably processing all the objective wafers PW by a desired film deposition process in high in-surface and inter-wafer uniformity when the number of the objective wafers PW is smaller than the holding capacity of the wafer boat 17, and of efficiently carrying out a desired film deposition process.

Although the invention has been described in its preferred embodiments, the present invention is not limited thereto and the following various modifications are possible.

(1) There is no limit to the number of the reference distribution patterns and may be optionally determined.

(2) Objective workpieces to be processed can be placed in any holding parts specified by the reference distribution pattern in processing a number of objective workpieces smaller than the reference number of the reference distribution pattern.

(3) The present invention is not limited to the vertical thermal processing apparatus in its practical application, and is applicable to horizontal thermal processing apparatuses including a horizontal reaction vessel for holding workpieces in a vertical position in a vertical arrangement.

(4) The holding capacity of the wafer boat, i.e., a workpiece holder, is not limited to 100 workpieces.

Reference Experiments

A wafer boat (17) having a loading capacity of 100 objective wafers was loaded with 100 objective wafers (PW) in the reference distribution pattern L100 shown in FIG. 3; that is, the wafer boat (17) was fully loaded. The thus fully loaded wafer boat (17) was carried into a reaction tube (11) to subject the objective wafers (PW) to a film deposition process for depositing a silicon nitride film (SiN film) in a desired thickness of 150 nm. The processing conditions for the reference distribution pattern L100 included heating the objective wafers (PW) at a desired temperature (processing temperature) of 760° C. The thickness uniformity of the SiN film formed on each objective wafers (PW), i.e., the in-surface uniformity, was ±2.0%. The inter-wafer thickness uniformity between the semiconductor wafer held in the 8th holding part from the bottom, i.e., the lowermost monitor wafer MW in FIG. 3, and the semiconductor wafer held in the 112nd holding part from the bottom, i.e., the uppermost monitor wafer MW) was ±0.5%.

Experiment 1

Twenty objective wafers (PW) were loaded into a wafer boat (17) having a holding capacity of 100 wafers in the reference distribution pattern L25 shown in FIG. 3. Five dummy wafers were placed in the vacant holding parts in the objective wafer distribution region R. The thus loaded wafer boat (17) was carried into a reaction tube (11) to subject the objective wafers (PW) to a film deposition process for depositing a silicon nitride film (SiN film) in a desired thickness of 150 nm. The processing conditions for the reference distribution pattern L25 included heating the objective wafers (PW) at a desired temperature (processing temperature) of 760° C. The thickness uniformity of the SiN film formed on each objective wafers (PW), i.e., the in-surface uniformity, was ±1.0%. The inter-wafer thickness uniformity between the semiconductor wafer held in the 17th holding part from the bottom, i.e., the lowermost monitor wafer MW in FIG. 3, and the semiconductor wafer held in the 104th holding part from the bottom, i.e., the uppermost monitor wafer MW) was ±0.5%.

The objective wafers (PW) were distributed in the wafer boat (17) in the reference distribution pattern L25 selected on the basis of the number of the objective wafers (PW) and were processed by the film deposition process under the processing conditions for the reference distribution pattern L25. The result of the film deposition process proved that the film deposition process could process the objective wafers (PW) in high in-surface uniformity and high inter-wafer uniformity, even though the number of the dummy wafers was small.

The thermal processing method of the present invention selects the reference distribution pattern corresponding to the number of the workpieces to be processed smaller than the holding capacity of the workpiece holder, processes the workpieces under the processing conditions set on the basis of the selected reference distribution pattern, and uses dummy workpieces necessary to realize a distribution conforming to the selected reference distribution pattern. Consequently, the number of the necessary dummy workpieces can be reduced, the running cost can be reduced, and the workpieces can be efficiently processed by the predetermined thermal process. Moreover, since the workpieces can be distributed in a distribution exactly conforming to the selected reference distribution pattern, each of the workpieces can be processed basically in high in-surface uniformity, and the workpieces disposed at different positions can be processed in high inter-workpiece uniformity.

The thermal processing apparatus of the present invention is capable of carrying out the foregoing thermal processing method with reliability. Thus, the thermal processing apparatus of the present invention is capable of processing workpieces in high in-surface uniformity and in inter-workpiece uniformity even if the number of workpieces is smaller than the holding capacity of the workpiece holder, and a small number of dummy workpieces are used. Thus the thermal processing apparatus is capable of efficiently carrying out a desired thermal process.

Second Embodiment

Figure 5:
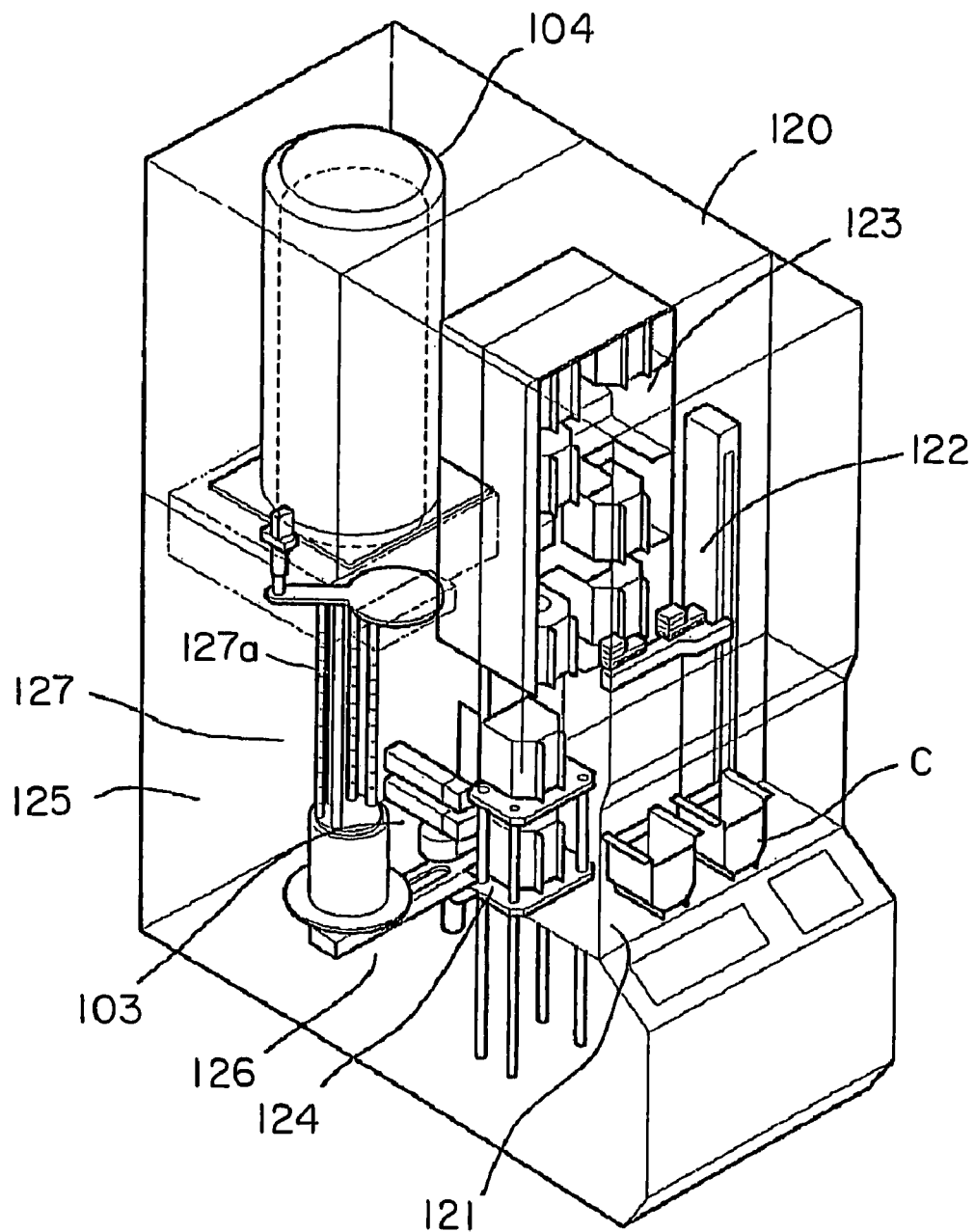
FIG. 5 is a perspective view of a thermal processing apparatus in a second embodiment according to the present invention.

A vertical thermal processing apparatus in a second embodiment will be described as applied to carrying out a thermal process. FIGS. 5 and 6 show the vertical thermal processing apparatus in the second embodiment. Shown in FIG. 5 are a casing 120, i.e., housing, a receiving/delivering unit 121, a carrier carrying mechanism 122, a carrier storage unit 123, and a transfer stage 124. A carrier C containing semiconductor wafers (hereinafter, referred to simply as "wafer") W, i.e., workpieces, not shown in FIG. 5, delivered to the receiving/delivering unit 121 is carried by the carrier carrying mechanism 122 to the carrier storage unit 123 for temporary storage. The carrier C is carried from the carrier storage unit 123 to the transfer stage 124. A wafer carrying mechanism 103 is installed in a wafer loading chamber 125. The wafer carrying mechanism 103 takes out the wafers W from the carrier C placed on the transfer stage 124, and transfers the wafers W to a wafer boat 127, i.e., a wafer holder, having holding parts 127a and mounted on a boat elevator 126. The wafer boat 127 is elevated by the boat elevator 126 into a furnace 104.

The furnace 104 and the associated components will be described with reference to FIG. 6. Referring to FIG. 6, the furnace 104 comprises a double-wall reaction tube 141 including a inner tube 141a formed of, for example, quartz and having open opposite end, and an outer tube 141b formed of, for example, quartz and having a closed upper end; and a heating unit 105 disposed so as to surround the reaction tube 141. The heating unit 105 includes, for example, three heaters 105a, 105b and 105c, such as resistive heaters, respectively corresponding to vertically arranged heating zones of a thermal processing space in the reaction tube 141. The heaters 105a, 105b and 105c are controlled individually.

Both the inner tube 141a and the outer tube 141b of the reaction tube 141 are supported on a cylindrical manifold 142. A plurality of gas supply pipes 143 (only two gas supply pipes are shown in FIG. 6 for convenience) are provided so as to open into a lower region in the inner tube 141a. An exhaust pipe 144 has one end opening into a space between the inner tube 141a and the outer tube 141b, and the other end connected to a vacuum pump, not shown, to exhaust the reaction tube 141. The inner tube 141a, the outer tube 141b and the manifold 142 constitute a reaction vessel. A lid 145 attached to the upper end of the boat elevator 126 closes the lower end opening of the manifold 142. The wafer boat 127 is mounted on an insulating unit 147 supported on a turntable 146 disposed on the lid 145 so as to be driven for rotation by a drive unit, not shown.

Figure 7:
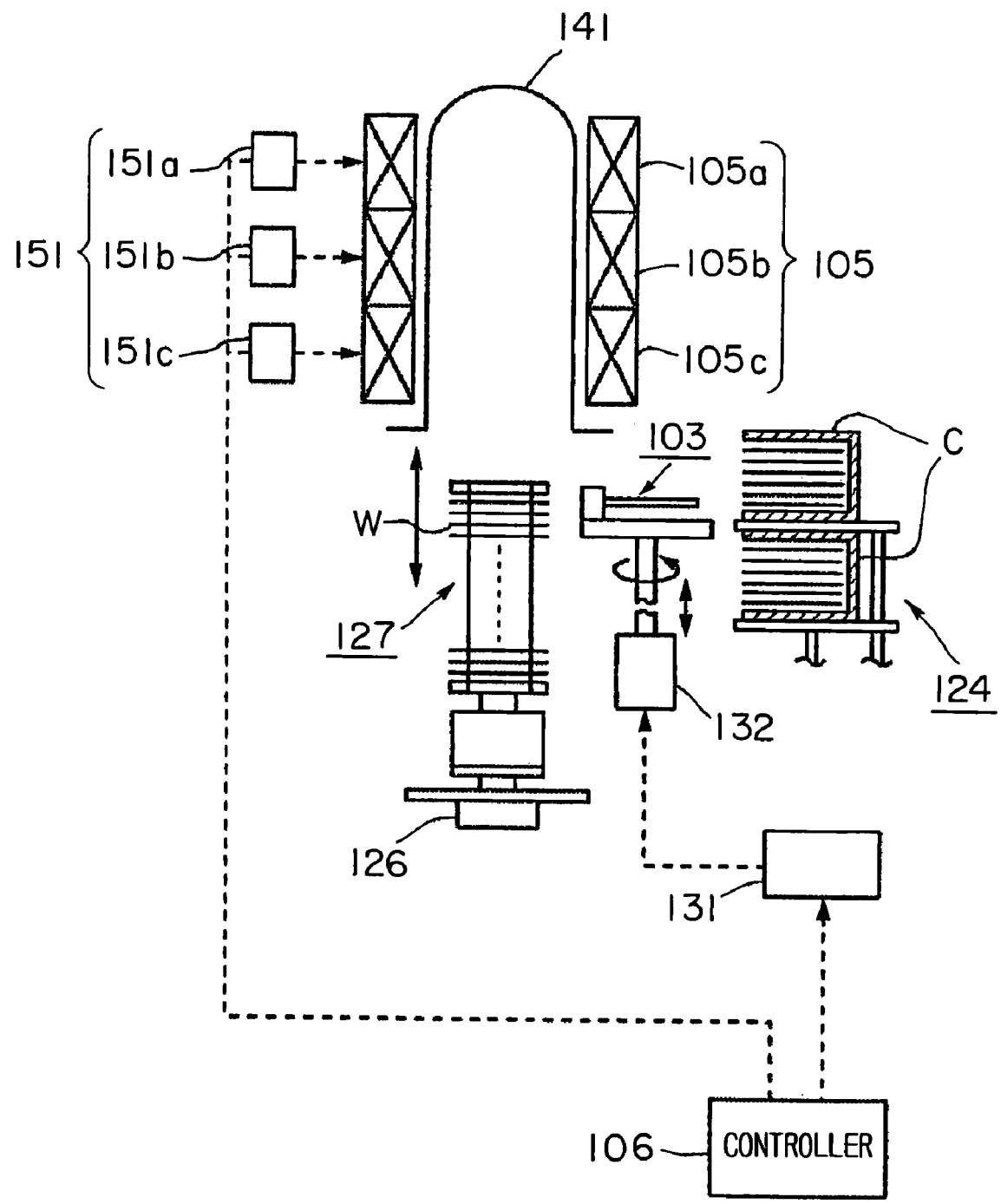
FIG. 7 is a view of assistance in explaining the connection of devices and a controller.

Those components of the thermal processing apparatus in the second embodiment and a control system will be described with reference to FIG. 7. A controller 106 controls heater controllers 151, namely, heater controllers 151a, 151b and 151c respectively for controlling the heaters 105a, 105b and 105c of the heating unit 105, to control the temperatures of the heating zones of the thermal processing space in the reaction tube 141. The controller 106 controls a transfer controller 131 to control the operation of a drive unit 132 for driving the wafer carrying mechanism 103. For example, Objective wafers or dummy wafers contained in a carrier C placed on the transfer stage 124 are transferred to and distributed in the wafer boat 127 in accordance with a predetermined wafer distribution pattern, and the heaters 105a, 105b and 105c of the heating unit 105 are controlled to heat the heating zones in a desired heating mode selectively determined according to the wafer distribution pattern. The constitution of the controller 106 will be described with reference to FIGS. 8 to 10 with those functions of the controller 106 in mind.

Figure 8:
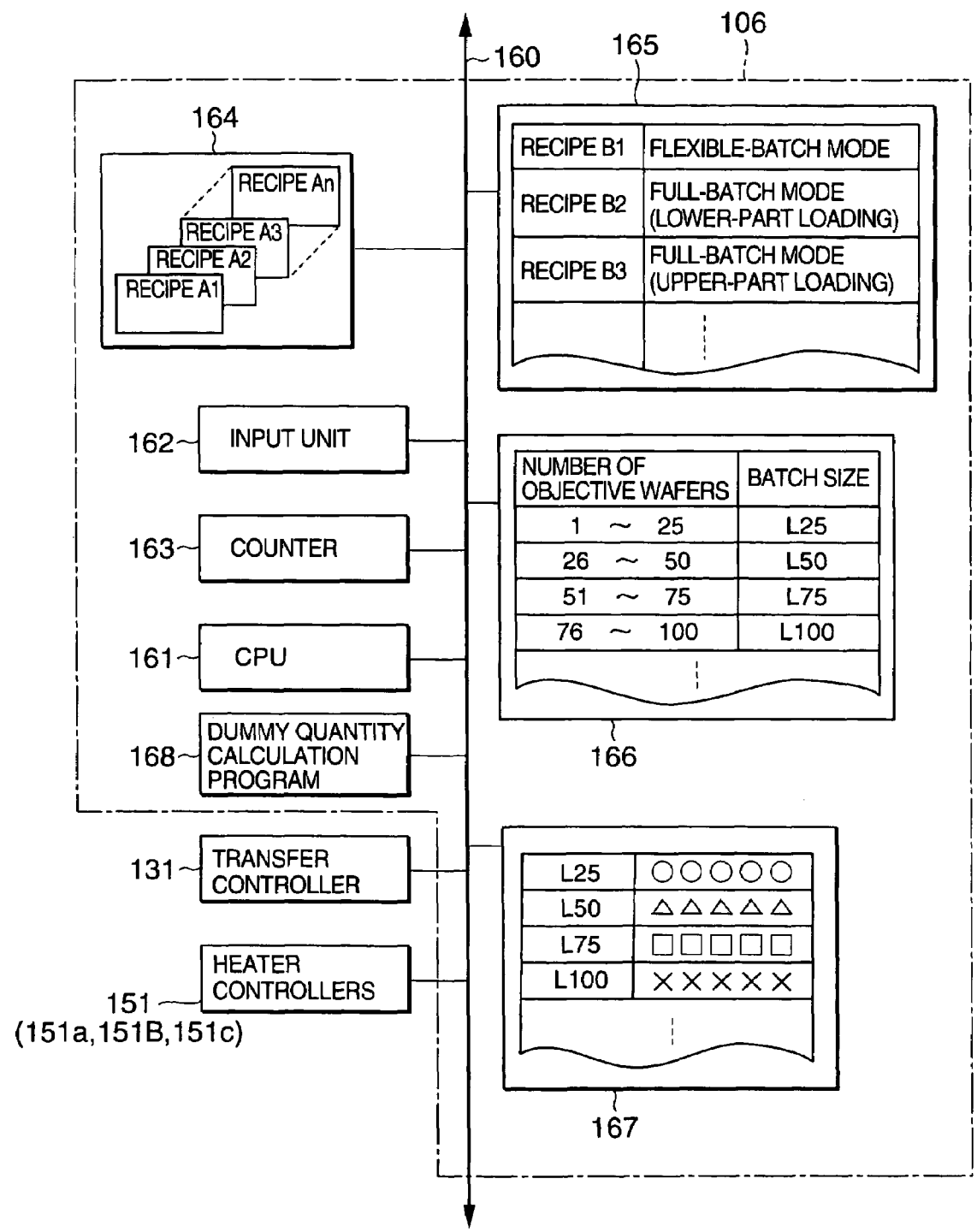
FIG. 8 is a block diagram of the controller shown in FIG. 7.

Referring to FIG. 8, the transfer controller 131 and the heater controllers 151 (heater controllers 151a, 151b and 151c) control the associated components according to control signals provided by a CPU 161 included in the controller 106. An input unit 162 and a counter 163 included in the controller 106 are connected to a bus 160. The input unit 162 is operated to enter a process recipe, a wafer distribution pattern, parameters and such. The input unit 162 includes, for example, a touch panel or a keyboard provided in the front panel of the thermal processing apparatus. The counter 163 counts the number of objective wafers contained in a carrier C received by the receiving/delivering unit 121 on the basis of a signal provided by a mapping sensor, not shown, such as a reflection optical sensor. Information about positions where carriers C are to be stored in the carrier storage unit 123, and times when the objective wafers contained in the carriers C are to be subjected to a thermal process are given previously to the controller 106. Thus, the number of objective wafers to be subjected to the batch thermal process can be known by counting the number of objective wafers contained in carrier C upon the reception of the carrier C by the receiving/delivering unit 121. Practically, a controller included in a processing apparatus used in the preceding process or a host computer gives the controller 106 information about the number of objective wafers contained in a carrier C to be delivered to the vertical thermal processing apparatus. Therefore, the number of objective wafers contained in each carrier C can be known without counting the objective wafers with the mapping sensor. However, it is effective in enhancing reliability to count the number of objective wafers contained in each carrier C upon the reception of the carrier C.

Storage units storing data and programs to which the CPU 161 refers, are connected to the bus 160. Shown in FIG. 8 are a process recipe storage unit 164, a loading mode storage unit 165, a batch size table storage unit 166, and a distribution pattern storage unit 167. Indicated at 168 is a dummy quantity calculation program.

Figure 9:
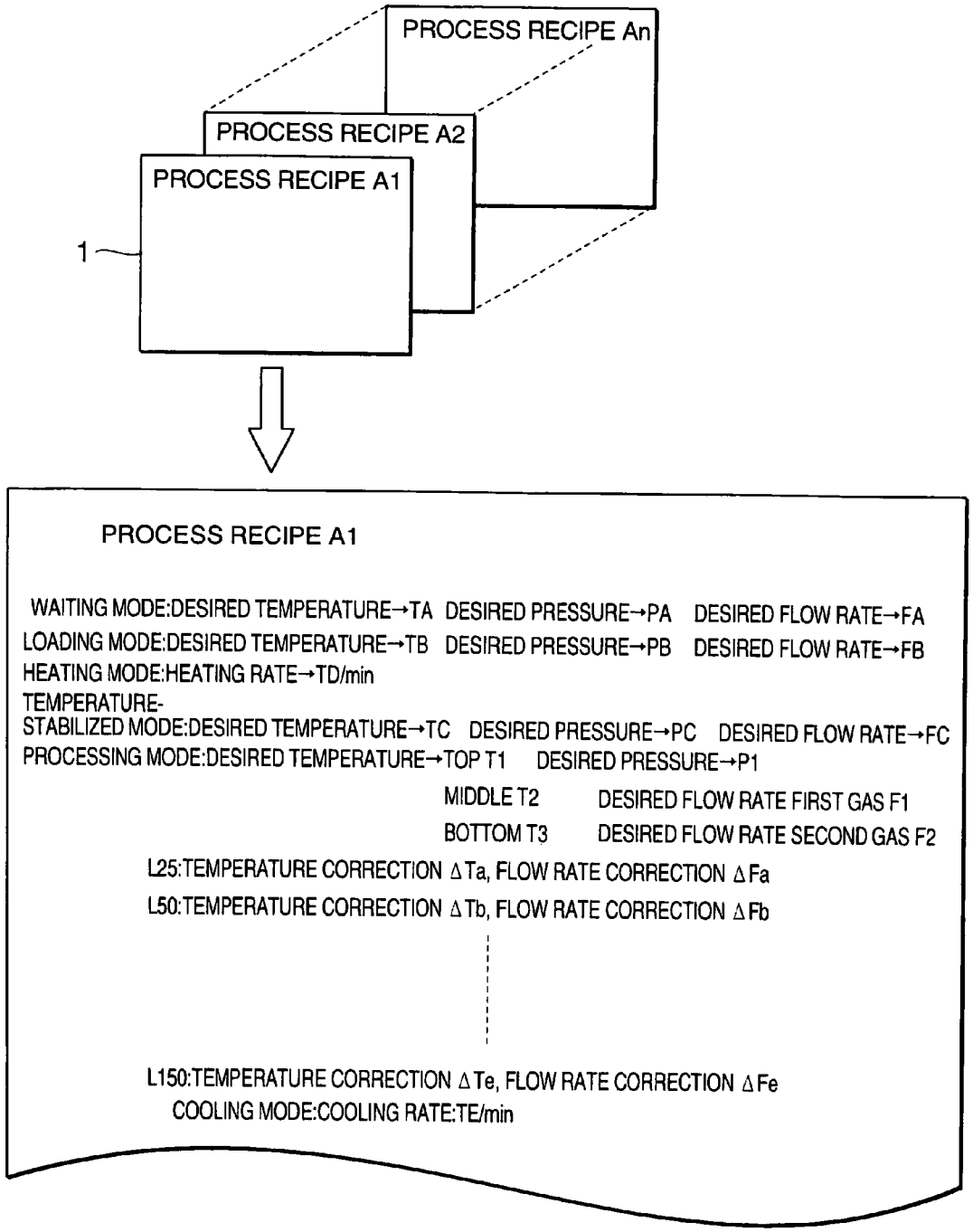
FIG. 9 is a view showing the configuration of a process recipe storage unit included in the controller.

The process recipe storage unit 164 stores a plurality of process recipes (processing conditions) Al to An storing parameters of a thermal process and a processing procedure. As shown in FIG. 9, by way of example, each process recipe contains desired temperatures TA, TB and TC, desired pressures PA, PB and PC, desired flow rates FA, FB and FC respectively for a waiting mode, a loading mode and a temperature-stabilized mode, heating rate TD, cooling rate TE, reference processing temperatures T1, T2 and T3 corresponding to the heating zones to be heated by the heaters 105a, 105b and 105c of the heating unit 105, respectively, a desired processing pressure P1, and flow rates F1 and F2 at which a first gas and a second gas are to be supplied.

The number of objective wafers to be loaded into the wafer boat 127 does not necessarily coincides with the loading capacity of the wafer boat 127. In some cases, objective wafers loaded into the wafer boat 127, in which vacant workpiece holding spaces are left, in the wafer boat 127 are subjected to a thermal process. The desired processing temperatures T1, T2 and T3 corresponding to the top, middle and the bottom heating zones are reference processing temperatures for processing objective wafers loaded into the wafer boat 127 without leaving any vacant workpiece holding spaces in the wafer boat 127. The process recipe also includes temperature corrections for adjusting the reference processing temperatures T1, T2 and T3 corresponding to the top, middle and bottom heating zones according to the number of objective wafers. In FIG. 9, temperature corrections $\Delta F$, i.e., temperature corrections $\Delta Fa$ to $\Delta Fe$ for the desired temperature for the top heating zone are shown as representative examples in FIG. 9. Shown also in FIG. 9 are flow rate corrections $\Delta F$, i.e., flow rate corrections $\Delta Fa$ to $\Delta Fe$.

When the thermal processing apparatus in the second embodiment carries out a thermal process in a flexible-batch mode, the processing temperature corrections $\Delta Ta$, $\Delta Tb$, ... and $\Delta Te$ are assigned, for example, to reference distribution patterns L25 for a batch of 1 to 25 wafers, L50 for a batch of 26 to 50 wafers, ... and L150 for a batch of 126 to 150 wafers, respectively. When the batch size for the reference distribution pattern L25 is selected, the correction $\Delta Ta$ is added to the reference processing temperature T1 to determine a desired processing temperature TF, not shown. When a full-batch mode is selected, for example, a desired processing temperature TF may be the reference processing temperature T1 or may be determined by correcting the reference processing temperature T1.

Referring again to FIG. 8, the loading mode storage unit 165 constitutes a distribution pattern selector together with the CPU 161 and the input unit 162. The loading mode storage unit 165 stores mode selection recipes specifying loading modes of loading the wafer boat 127, such as a full-capacity loading mode or a partial-capacity loading mode, loading manners of loading the wafer boat 127. When the full-capacity loading mode is selected, objective wafers are loaded into the wafer boat 127 in an upper-part loading manner where the objective wafers are placed from the top holding space of the wafer boat 127 downward, a lower-part loading manner where the objective wafers are placed from the bottom holding space of the wafer boat 127 upward, or a middle-part loading manner where objective wafers are placed from the middle holding space of the wafer boat 127 upward and downward, and a manner where dummy wafers are placed in vacant holding spaces left after loading all the objective wafers. For example, a flexible-batch mode specified in the mode selection recipe B1 specifies a thermal processing mode where a number of objective wafers smaller than the loading capacity of the wafer boat 127 are processed and leaving vacant holding parts, without fully loading the wafer boat 127. See to the reference distribution patterns L100, L75, L50 and L25 shown in FIG. 10. In full-batch modes specified in the mode selection recipes B2 and B3, the wafer boat 127 is fully loaded with objective wafers, or with both objective wafers and dummy wafers without leaving any vacant workpiece holding spaces holding parts in the wafer boat 127 is fully loaded regardless of the number of objective wafers to be processed.

The batch size table storage unit 166 and the distribution pattern storage unit 167 store data to which reference is made when, for example, the mode selection recipe B1 specifying the flexible-batch mode is selected. The batch size table storage unit 166 stores a batch size table showing batch sizes, and the ranges of the numbers of objective wafers included in the batch sizes, respectively. The batch size is determined from the batch size table on the basis of the number of objective wafers to be processed. As mentioned in connection with the explanation of the temperature correction specified in the process recipe An, a plurality of batch sizes specifying multiples of twenty-five are set for the reference distribution patterns L25 to L150, and the reference distribution patterns L25 to L150 corresponding to those batches are stored in the distribution pattern storage unit 167.

Figure 10:
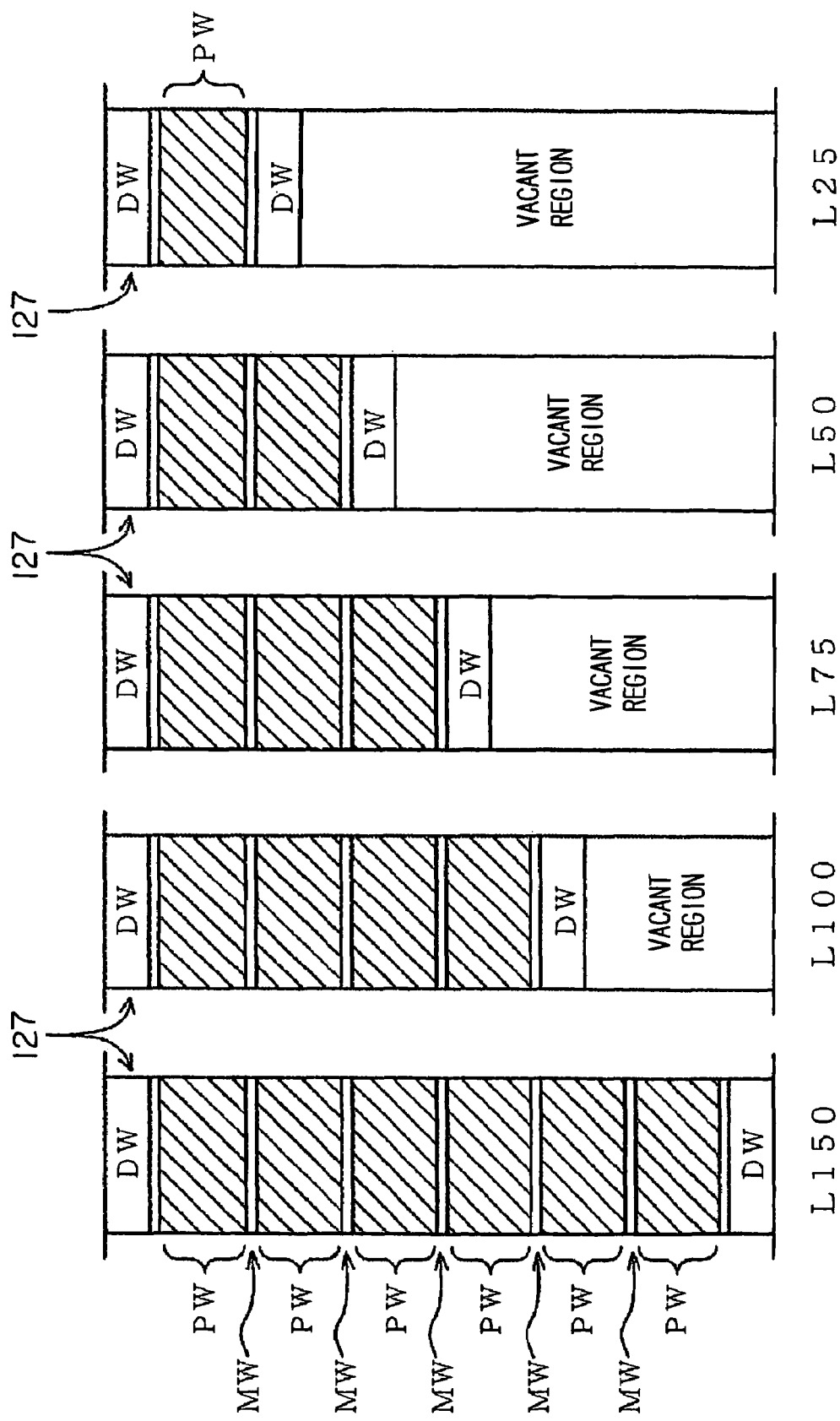
FIG. 10 is a view of examples of distribution patterns stored in a distribution pattern storage unit included in the controller.

FIG. 10 shows the reference distribution patterns L25 to L150 stored in the distribution pattern storage unit 167. FIG. 10 shows objective wafers loaded in the upper-part loading manner for the distribution patterns excluding the distribution pattern L150 in which the wafer boat 127 is fully loaded. In FIG. 10, shaded areas indicate holding blocks of holding parts holding objective wafers PW. Each of the holding blocks has twenty-five workpiece holding spaces for holding twenty-five objective wafers PW. Dummy wafers DW are held in holding spaces in top and bottom sections in a wafer holding zone to suppress the difference in the effect of a thermal process between objective wafers PW held in end parts of the wafer holding zone, and those held in the middle part of the wafer holding zone. The dummy wafers DW include wafers called side dummies or extra dummies. The number of the dummy wafers DW for the upper end section is in the range of 1 to 4, and that for the lower end section is in the range of 1 to 11. One monitor wafer is held in a holding part between the adjacent holding blocks.

Although the holding blocks are represented by the shaded areas in FIG. 10 for convenience, objective wafers PW are not held necessarily in all the workpiece holding spaces of each holding block. Each holding block has twenty-five holding parts. Therefore, when objective wafers PW are not placed in all the workpiece holding spaces of each holding block and vacant workpiece holding spaces are left in the holding block, dummy wafers are placed in the vacant workpiece holding spaces. Dummy wafer distribution rules of distribution of dummy wafers DW together with objective wafers PW in each holding block are stored, for example, together with the wafer distribution patterns. A dummy wafer distribution rule specifies, for example, placing objective wafers PW from the top holding space in the holding block downward, and placing dummy wafers DW in lower vacant holding spaces.

The relation between the wafer distribution patterns and the process recipes (processing conditions) will be explained. The process recipe includes the reference processing temperatures T1, T2 and T3 which set individually for the heating zones to be heated by the heaters 105a, 105b and 105c of the heating unit 105 as shown in FIG. 9. When a thermal process is performed in the flexible-batch mode, the respective thermal outputs of the heaters 105a to 105c are adjusted according to the distribution of objective wafers. Therefore, the number of the temperature corrections is equal to that of the wafer distribution patterns. For example, objective wafers distributed in the reference distribution pattern L25 shown in FIG. 10 are held in the wafer boat 127 in the upper-part loading manner. However, since the upper-part loading manner, the middle-part loading manner and the lower-part loading manner can be specified, three temperature corrections ΔTa, namely, temperature corrections ΔTa1, ΔTa2 and ΔTa3, are determined for the reference distribution pattern L25. More specifically, each of the temperature corrections includes three parameters specifying the heaters 105a, 105b and 105c of the heating unit 105, and hence each process recipe includes forty-five parameters (=5 (the number of batch sizes)×3 (the number of the loading manners)×3 (the number of the heaters)).

The CPU 161 executes the dummy quantity calculating program 168 including the steps of calculating the difference between the number of objective wafers to be processed in a batch, and the batch size selected according to the number of objective wafers, and calculating the number of dummy wafers corresponding to the calculated difference.

Figure 11:
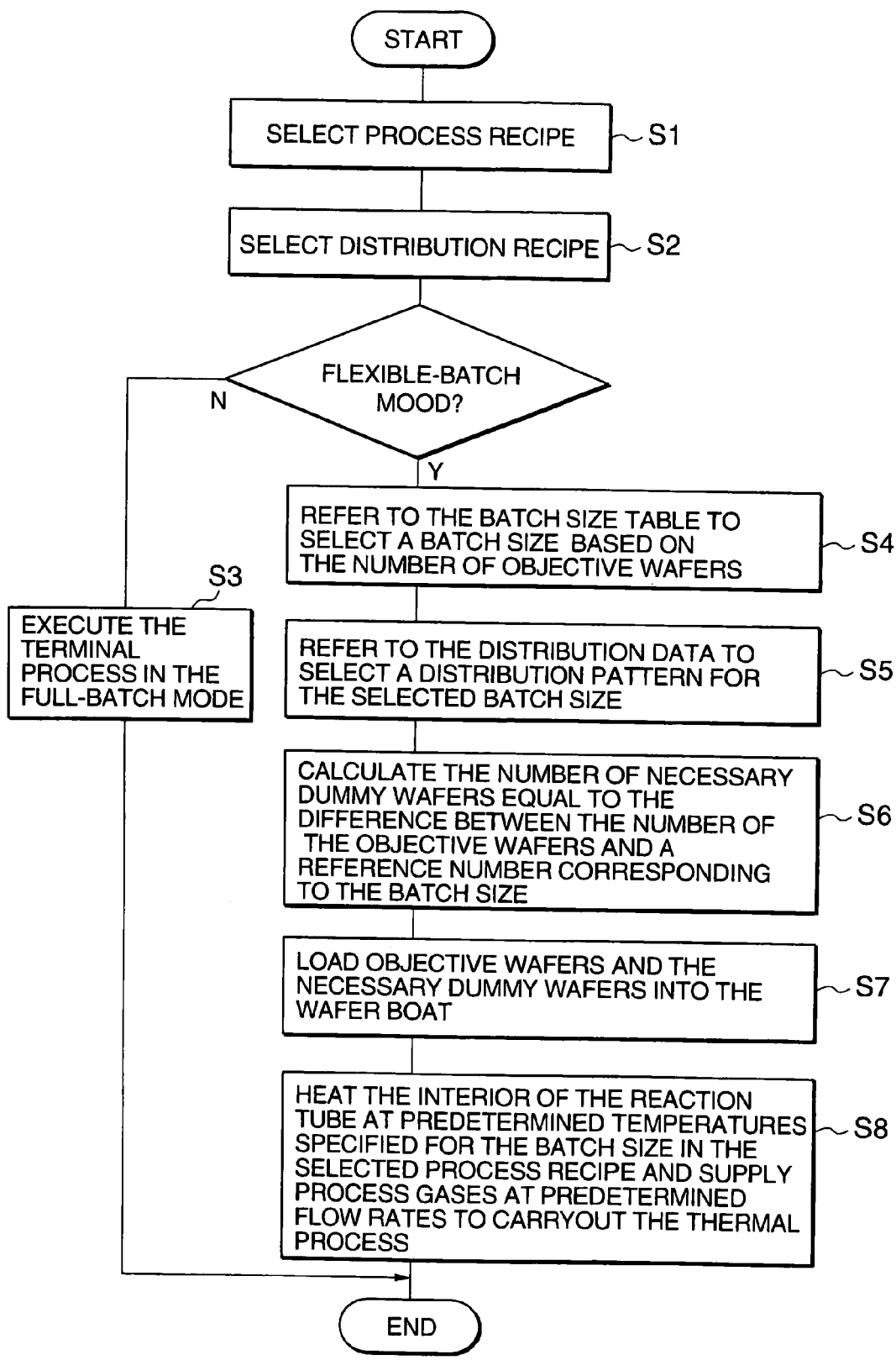
FIG. 11 is a flow chart of assistance in-explaining the operation of the thermal processing apparatus shown in FIG. 5.

The operation of the thermal processing apparatus in the second embodiment will be described with reference to a flow chart shown in FIG. 11. A process recipe specifying processing conditions for a thermal process to which objective wafers are to be subjected is selected in step S1. Then, a distribution recipe is selected in step S2. The distribution recipes are classified roughly into those for a full-batch distribution mode and those for a flexible-batch distribution mode. If the full-batch distribution mode is selected, the program goes to step S3. If the flexible-batch mode is selected, the program goes to step S4.

When the full-batch distribution mode is selected, the wafer carrying mechanism 103 loads objective wafers and dummy wafers in that order into the wafer boat 127 by the loading procedure specified in the full-batch distribution mode selected in step S1, such as the full-batch distribution mode B2 shown in FIG. 8, to load the wafer boat 127 in a fully loaded state. Then, the objective wafers and the dummy wafers loaded into the wafer boat 127 are subjected to the thermal process. Although the full-batch distribution mode is used, for example, for a maintenance process, the same may be used for the actual thermal process.

When the process recipe selected in step S1 specifies the flexible-batch distribution mode, a batch size corresponding to the number of objective wafers is selected in step S4. The operation in step S4 makes reference to the batch size table to find a batch size including the number of the objective wafers counted by the counter 163 for one of the reference distribution patterns L25 to L150. Suppose that the counted number of the objective wafers is forty. Then, the reference distribution pattern L50 is selected because the number of the objective wafers is included in a batch size for numbers between twenty-six and fifty.

The following explanation will be made on the assumption that the counted number of the objective wafers is forty, and the batch size is for numbers between twenty-six and fifty. A wafer distribution pattern specified by the reference distribution pattern L50 is selected in step S5, and the number of necessary dummy wafers is calculated in step S6. The number of necessary dummy wafers is equal to the difference between the previously counted number of the objective wafers PW and the number of the holding parts required by the reference distribution pattern L50. In this case, the number of necessary dummy wafers is 50−40=10. In step S7, the wafer carrying mechanism 103 operates according to a control signal provided by the transfer controller 131 to distribute the forty objective wafers PW and ten dummy wafers DW in the reference distribution pattern L50 (FIG. 10) in the holding parts in the holding blocks of the wafer boat 127.

Reference is made to the dummy wafer distribution rule stored together with the reference distribution pattern L50 in distributing the dummy wafers DW together with the objective wafers PW in each holding block. After distributing the objective wafers PW and the dummy wafers DW according to the dummy wafer distribution rule, monitor wafers MW are placed in the holding parts for monitor wafers MW. As shown in FIG. 10, the reference distribution pattern L50 includes three monitor wafers MW, four upper dummy wafers DW (upper side wafers) and eleven lower dummy wafers DW, i.e., two upper extra dummy wafers and nine lower side dummy wafers. After thus loading the wafer boat 127 with the sixty-eight wafers, the boat elevator 126 elevates the wafer boat 127 into the reaction tube 141.

In step S8, the interior of the reaction tube 141 is heated at predetermined temperatures specified in the previously selected process recipe. The set temperatures specified in the process recipe are corrected according to the batch size and the distribution of the objective wafers PW determined on the basis of the batch size, and the interior of the reaction tube 141 is heated at corrected temperatures. Suppose that the heating zones corresponding to the heating units 105a, 105*b* and 105*c* of the heater 105 are to be heated at desired temperatures T1, T2 and T3, and the desired temperatures T1, T2 and T3 are to be corrected by temperature corrections ΔL1, ΔL2 and ΔL3 for the reference distribution pattern L50. Then, the heating units 105*a*, 105*b* and 105*c* heat the corresponding heating zones at processing temperatures T1+ΔT1, T2+ΔT2 and T3+ΔT3, respectively. After the heating zones corresponding to the heating units 105*a*, 105*b* and 105*c* have been stabilized at the processing temperatures T1+ΔT1, T2+ΔT2 and T3+ΔT3, respectively, the predetermined process gases are supplied at predetermined flow rates into the reaction vessel, and the gases are discharged from the reaction vessel to adjust the pressure in the reaction vessel to a predetermined processing pressure. The objective wafers thus heated are processed by a film deposition process, i.e., a thermal process.

As mentioned above, when the thermal processing apparatus in the second embodiment carries out a thermal process in the flexible-batch mode, the objective wafers are processed under processing conditions determined for the batch size of the objective wafers. Therefore, the frequency of using dummy wafers and time necessary for loading the wafer boat 127 with wafers can be reduced. The series of automatic operations for the selection of the reference distribution pattern according to the batch size of objective wafers PW, the calculation of the number of dummy wafers DW needed to fill up the vacant holding spaces in the wafer boat 127, the loading of the objective wafers PW and the dummy wafers DW into the wafer boat 127 by the wafer carrying mechanism 103 can reduce load on operators and increases throughput.

Since optimum process recipes are prepared for the reference distribution patterns to process objective wafers PW distributed in the wafer boat 127 uniformly regardless of distribution patterns, the objective wafers PW can be processed uniformly and products of a uniform quality can be produced from the processed objective wafers PW regardless of the batch size of the objective wafers PW.

The flexible operation of the thermal processing apparatus is possible because either the full-batch mode, which fully loads the wafer boat 127 with objective wafers PW or with both objective wafers PW and dummy wafers DW without leaving any vacant holding parts in the wafer boat 127 regardless of the number of objective wafers PW to be processed, or the flexible-batch mode, which loads the wafer boat 127 in a workpiece distribution pattern corresponding to the batch size of objective wafers PW, is selected before starting a batch thermal process. For example, the full-batch mode which is often used for a maintenance operation or the like, can omit some steps needed by the flexible-batch mode and can start a thermal process quickly.

Although only the correction of the desired temperatures has been described in connection with the process recipe and the reference distribution pattern (or batch size), the pressure in the reaction vessel and the flow rates of the process gases, or heating rate may be changed according to, for example, the reference distribution pattern or batch size.

The ability to select an optional reference distribution pattern is a significant feature of the thermal processing apparatus in the second embodiment. The positions of the dummy wafers are not limited only to those over and under the objective wafer distributing range. The dummy wafers may be placed also in the holding spaces in the objective wafer distributing range. The monitor wafers may be omitted. The present invention is applicable not only to the thermal processing apparatus for a film deposition process but also thermal processing apparatuses for oxidation processes and impurity diffusion processes, such as oxidation/diffusion furnaces.

As apparent from the foregoing description, according to the present invention, wafers can be highly uniformly processed by a batch thermal process regardless of the batch size, and therefore load on operators can be reduced and through put can be improved.

What is claimed is:

1. A thermal processing method of processing workpieces by a thermal process in a reaction vessel by placing the workpieces in workpiece holding spaces in a workpiece holder by a loading means, and carrying the workpiece holder loaded with the workpieces into the reaction vessel, said thermal processing method comprising:

a distribution pattern determining step of determining a workpiece distribution pattern in which the workpieces are distributed in the workpiece holder on a basis of the number of workpieces to be processed; and a loading step of loading the workpieces into the workpiece holder in the thus determined workpiece distribution pattern by the loading means wherein a batch size range including a number of workpieces to be processed is specified from a plurality of batch size ranges with reference numbers equal to or smaller than a holding capacity of the workpiece holder, the workpiece distribution pattern being determined on a basis of the specified batch size range, the batch size ranges include a small batch size range with its reference number equal to or smaller than half the holding capacity of the workpiece holder, and in the workpiece distribution pattern determined in accordance with the small batch size range, at least one vacant workpiece holding space is left between each workpiece and the adjacent workpiece held in the workpiece holder when the workpieces are distributed in the workpiece distribution pattern.

2. The thermal processing method according to claim 1 wherein workpieces and dummy workpieces are held in the workpiece holder when the number of workpieces is smaller than the reference number of workpieces for the batch size range selected, and the number of the dummy workpieces is equal to the difference between the reference number and the number of workpieces.

3. The thermal processing method according to claim 1 wherein the workpiece distribution pattern in which the workpieces are distributed in the workpiece holder is selected from a plurality of workpiece distribution patterns stored in a distribution pattern storage unit.

4. The thermal processing method according to claim 3 wherein the distribution pattern storage unit stores workpiece distribution patterns, each specifying regions in which workpieces are to be distributed, and vacant regions in which any workpieces are not distributed.

5. The thermal processing method according to claim 4 further comprising a dummy workpiece quantity calculating step of comparing the number of workpieces specified by the selected workpiece distribution pattern and a number of workpieces to be processed, and calculating the number of dummy workpieces to be placed in vacant workpiece holding spaces on a basis of the result of comparison.

6. The thermal processing method according to claim 5 wherein the loading step loads the workpieces to be processed and the calculated number of dummy workpieces into the workpiece holder in the selected distribution pattern.

7. The thermal processing method according to claim 3 further comprising a batch size determining step of determining a batch size on the basis of the number of workpieces to be processed by making reference to a batch size table including a plurality of batch sizes, and wherein the distribution pattern selecting step selects the work distribution pattern corresponding to a batch size determined by the batch size determining step and workpiece distribution patterns stored in the distribution pattern storage unit.

8. A thermal processing apparatus comprising:
a workpiece holder having holding spaces in which workpieces are held;
a reaction vessel for containing the workpiece holder therein;
a heating means surrounding the reaction vessel;
a loading means for loading workpieces into the workpiece holder; and
a controller that determines a workpiece distribution pattern in which workpieces are to be distributed in the workpiece holder on a basis of the number of workpieces to be processed, and controls the loading means and the heating means on a basis of the workpiece distribution pattern, wherein
the controller stores a plurality of batch size ranges with reference numbers equal to or smaller than a holding capacity of the workpiece holder, the workpiece distribution patterns corresponding to the batch size ranges,
the plurality of batch size ranges include a small batch size range with a reference number equal to or smaller than half the holding capacity of the workpiece holder,
the controller selects a workpiece distribution pattern corresponding to a batch size range including the number of workpieces to be processed, and
when the controller determines the workpiece distribution pattern in accordance with the small batch size range, the controller causes at least one vacant holding space to be left between each workpiece and the adjacent workpiece held in the workpiece holder.

9. The thermal processing apparatus according to claim 8, wherein
the controller comprises: a distribution pattern storage unit storing batch size ranges including the numbers of workpieces to be processed, and workpiece distribution patterns corresponding to the batch size ranges; a processing condition storage unit storing processing conditions corresponding to the workpiece distribution patterns; a central processing unit that selectively reads a workpiece distribution pattern corresponding to the number of workpieces from the distribution pattern storage unit, and reads a processing condition on a basis of the selected workpiece distribution pattern from the processing condition storage unit; a loading means control unit that controls the loading means so that workpieces and dummy workpieces are distributed in the workpiece holder in the selected workpiece distribution pattern; and a heating means control unit that controls the heating means so that the workpieces are processed by a thermal process under the processing conditions read by the central processing unit.

10. The thermal processing apparatus according to claim 9 wherein
the controller further comprises a dummy workpiece quantity setting unit that calculates the difference between a reference number of the selected workpiece distribution pattern and the number of the workpieces, and sets the number of dummy workpieces to be used in combination with the workpieces.

11. The thermal processing apparatus according to claim 9, wherein
the heating means control unit is capable of controlling the heating means so that a plurality of heating zones in a thermal processing atmosphere in the reaction vessel are heated at processing temperatures determined respectively for the heating zones.

12. The thermal processing apparatus according to claim 8, wherein
the controller includes a distribution pattern storage unit storing workpiece distribution patterns in which workpieces are to be distributed in the workpiece holder; a distribution pattern selecting unit for selecting the workpiece distribution pattern corresponding to the number of workpieces to be processed from those stored in the distribution pattern storage unit; and a loading operation control unit for controlling the loading means to load workpieces into the workpiece holder in accordance with the selected workpiece distribution pattern.

13. The thermal processing apparatus according to claim 12, wherein
the distribution pattern storage unit stores workpiece distribution patterns, each specifying workpiece holding spaces in which workpieces are to be held, and vacant workpiece holding spaces in which any workpieces are not held.

14. The thermal processing apparatus according to claim 13, wherein
the controller further includes a dummy workpiece quantity calculating means that compares the number of workpieces to be processed and the number of workpieces specified by a selected workpiece distribution pattern, and calculates the number of dummy workpieces to be placed in the vacant workpiece holding spaces in a workpiece holding region on a basis of the result of comparison.

15. The thermal processing apparatus according to claim 12, wherein
the controller further comprises a batch size table storage unit storing a batch size table including the relation between a plurality of batch sizes and the numbers of workpieces included in batches;
wherein the distribution pattern selecting unit determines a batch size including the number of workpieces to be processed in a batch by making reference to the batch size table storage unit, and selects the workpiece distribution pattern corresponding to the determined batch size and workpiece distribution patterns stored in the distribution pattern storage unit.

16. The thermal processing apparatus according to claim 15, wherein
the controller further includes a process recipe storage unit storing processing conditions including values of parameters of thermal processes and processing procedures, and a processing condition selecting means for selecting processing conditions from the process recipe storage unit;
wherein the value of at least one of the parameters of each of the thermal processes is determined on a basis of a batch size.

17. The thermal processing apparatus according to claim 16, wherein the process recipe storage unit stores at least temperatures in the reaction vessel and gas flow rates as the parameters.

18. The thermal processing apparatus according to claim 12, wherein the controller further includes a distribution pattern recipe selecting means that stores full-batch distribution pattern recipes specifying fully loading the workpiece holder for a thermal process, and a flexible-batch distribution pattern recipe specifying loading the workpiece holder in a workpiece distribution pattern corresponding to the number of workpieces of a batch, and selects either the full-batch distribution pattern recipe or the flexible-batch distribution pattern recipe; and the controller selects the workpiece distribution pattern by the distribution pattern selecting means when the distribution pattern recipe selecting means selects the flexible-batch distribution pattern recipe.

* * * * *